(12) United States Patent
Kojima

(10) Patent No.: US 12,085,613 B2
(45) Date of Patent: Sep. 10, 2024

(54) SYSTEMS AND METHODS FOR STORING CALIBRATION DATA OF A TEST SYSTEM FOR TESTING A DEVICE UNDER TEST

(71) Applicant: Advantest Corporation, Tokyo (JP)

(72) Inventor: Shoji Kojima, Sindelfingen (DE)

(73) Assignee: Advantest Corporation, Tokyo (JP)

( * ) Notice: Subject to any disclaimer, the term of this patent is extended or adjusted under 35 U.S.C. 154(b) by 209 days.

(21) Appl. No.: 17/733,805

(22) Filed: Apr. 29, 2022

(65) Prior Publication Data

US 2022/0260633 A1 Aug. 18, 2022

Related U.S. Application Data

(63) Continuation of application No. PCT/EP2020/065564, filed on Jun. 4, 2020.

(51) Int. Cl.
*G01R 31/319* (2006.01)

(52) U.S. Cl.
CPC .............. *G01R 31/3191* (2013.01)

(58) Field of Classification Search
USPC .......................... 324/601; 713/189; 714/724
See application file for complete search history.

(56) References Cited

U.S. PATENT DOCUMENTS

| | | | |
|---|---|---|---|
| 5,629,880 A | 5/1997 | Negishi | |
| 5,923,098 A | 7/1999 | Olson | |
| 11,121,780 B2 * | 9/2021 | Baccouche | H04B 17/11 |
| 2003/0110427 A1 * | 6/2003 | Rajsuman | G11C 29/56 |
| | | | 714/724 |
| 2004/0181731 A1 | 9/2004 | Rajsuman et al. | |
| 2004/0186675 A1 | 9/2004 | Larson et al. | |
| 2012/0166812 A1 * | 6/2012 | Long | G06F 21/552 |
| | | | 713/189 |
| 2015/0177326 A1 * | 6/2015 | Chakraborty | G01R 31/3187 |
| | | | 375/224 |

* cited by examiner

*Primary Examiner* — Vincent Q Nguyen

(57) ABSTRACT

Embodiments of the present invention provide systems and methods for storing calibration data for a test system operable to test a device under test (DUT). The test system includes one or more channel modules and a device interface. A first part of the calibration data is stored on a non-volatile memory. The non-volatile memory can be disposed in different parts of the test system. The non-volatile memory is located on the device interface and can also be located on one or more of the channel modules, as well as an attachment of the test system. The non-volatile memory is associated with the one or more channel modules. The second part of the calibration data is stored on a non-volatile memory associated with the device-under-test interface.

20 Claims, 5 Drawing Sheets

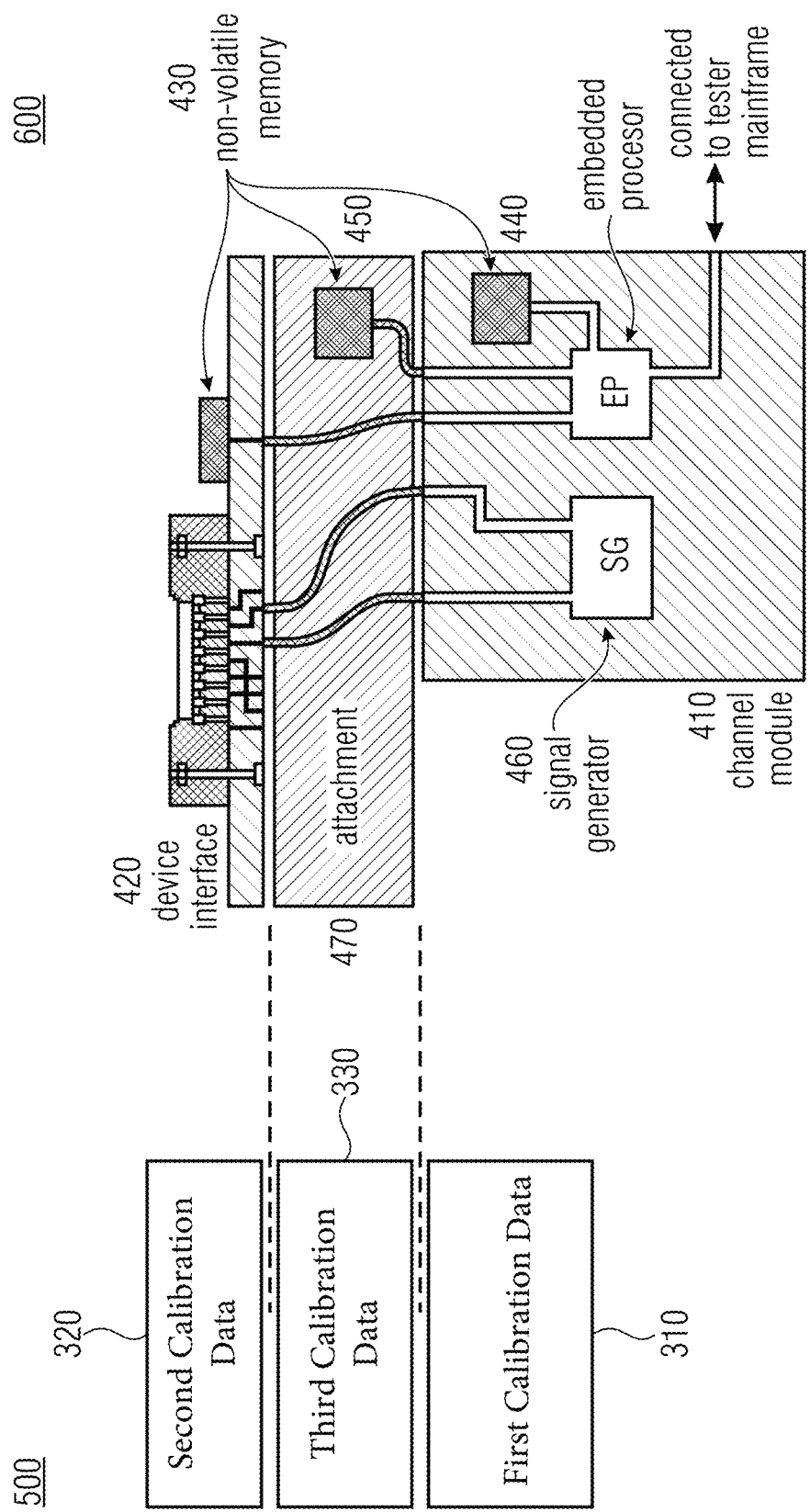

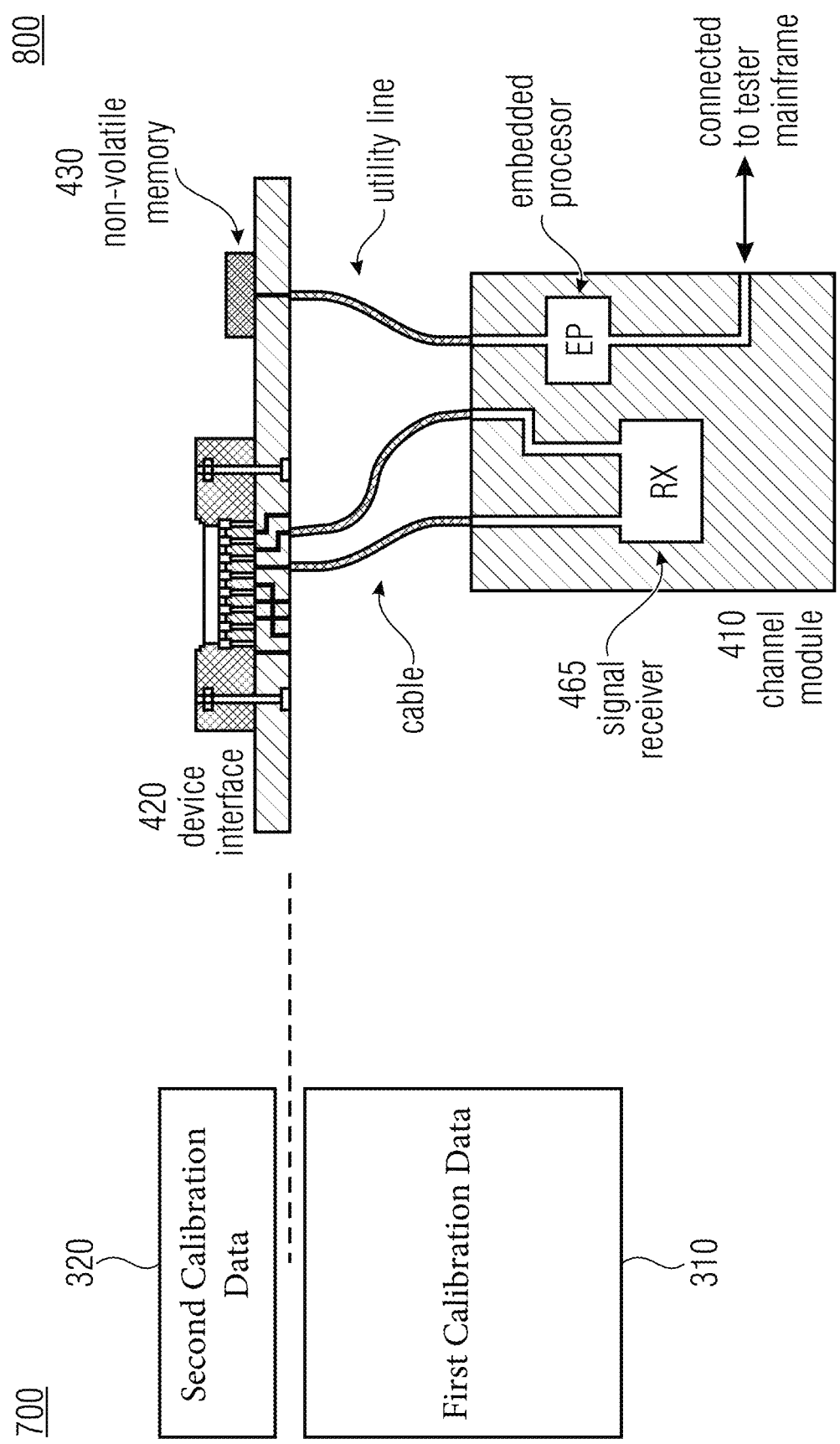

SYSTEMS AND METHODS FOR STORING CALIBRATION DATA OF A TEST SYSTEM FOR TESTING A DEVICE UNDER TEST

CROSS-REFERENCE TO RELATED APPLICATION

The present invention is related to and claims priority to International Patent Application No. PCT/EP2020/065564 filed on Jun. 4, 2020 with the European Patent Office, which is incorporated herein by reference as if fully set forth herein, under 35 U.S.C. § 120 and 363.

FIELD

Embodiments of the present invention generally relate to the field of device testing. More specifically, embodiments of the present invention relate to methods and systems for managing test calibration data.

BACKGROUND

A device or equipment under test (e.g., a DUT) is typically tested to determine the performance and consistency of the operation of the device before the device is sold. The device can be tested using a large variety of test cases, and the result of the test cases is compared to an expected output result. When the result of a test case does not match the expected output value, debugging is performed to identify and correct any defects that result from the device and/or to bin the device based on performance.

A DUT is usually tested by automatic or automated test equipment (ATE) that conducts complex testing using software and automation to improve efficiency. The DUT may be a memory device or other component intended to be integrated into a final product, such as a computer or other electronic device (e.g., a smartphone or appliance).

Structural tests enable systematic test coverage of individual structures (e.g., "cells") to support complex functions of a digital block within a System on a Chip (SOC). Structural tests typically include a variety of test methods such as Memory built-in self-test, BIST, Logic BIST (pattern generated on-chip) and Scan Test (pattern externally provided). Individual tests are combined to test blocks. For example, a scan test can be hierarchically applied to blocks (serially or in parallel).

Advanced structural test methodologies apply a combination of externally provided test data (stimulus from Automated Test Equipment, ATE) and an on-chip device for test (DFT), that expands externally provided test data, so-called seeds, into scan chains. Test results are compacted and compressed into a reduced amount of test data provided to the primary input-output interface (IO), of a SOC. This data is called received data and is compared by the ATE with expected data. The received data can also be masked by the ATE.

The DFT, also sometimes called design for testing or design for testability, typically consists of integrated circuit design techniques that add testability features to a hardware product design or device, e.g., the DUT. The added features enable the test system to develop and apply tests to the DUT more efficiency.

In order to get valid results from a device-under-test on the device interface, the device interface needs to be calibrated, such that the individual transmission path from a signal generator, SG, to a device-under-test, which is located on the device interface, does not lead to additional unwanted changes of the test results for the device-under-test. In other words, the transmission path of the signal must be compensated to improve the test results.

FIG. 1 depicts prior art details of a test system having a transmission path. The channel module 100 includes a signal generator (SG) 110 that sends a signal to the device-under-test on the DUT interface 130 through the transmission path (e.g., using cable 120) and sends a signal to the device-under-test on the DUT interface 130. A channel module generates a signal to be sent to the device-under-test. The transmission path from the device-under-test to a signal receiver on a channel module can be compensated in a test system, where a channel module receives data from the device-under-test.

FIG. 2 depicts a device interface 210, a test head 220, and a tester mainframe 230, where the complete calibration data can be stored in the tester mainframe. However, there are economic challenges to scaling scan tests with complex SOCs enabled by recent advancements in fabrication processes. For example, the escalating amount of test data that needs to be stored on the ATE poses a storage problem, and the test data must be passed to the SOC IO a number of times. Moreover, the increasing on-chip complexity makes it difficult to distribute test data to blocks-under-test and to create the required clock signals. In addition, quality and reliability expectations of complex SOCs require structural tests when the SOC is deployed in the end-application (e.g., in automotive systems or communication infrastructure).

Conventionally, calibration data used by these systems includes only propagation delay information for each transmission path. However, with the recent developments in high-speed interfaces, where transmission path frequencies can be significantly higher than 5 GHz, frequency characteristic information of the transmission paths should also be included in the calibration information to compensate for the loss on the transmission paths. In view of this situation, there is a desire for a concept which provides for an improved compromise between data to be stored, processing speed and quality and reliability of tests when testing devices under test with an automated test equipment.

SUMMARY

Embodiments of the present invention provide systems and methods for storing calibration data for a test system operable to test a device under test (DUT). The test system includes one or more channel modules and a device interface. A first part of the calibration data is stored on a non-volatile memory. The non-volatile memory can be disposed in different parts of the test system. The non-volatile memory is located on the device interface and can also be located on one or more of the channel modules, as well as an attachment of the test system. The non-volatile memory is associated with the one or more channel modules. The second part of the calibration data is stored on a non-volatile memory associated with the device-under-test interface.

According to one embodiment, a method of storing calibration data of a test system is disclosed. The method includes storing first calibration information of the calibration data on a first non-volatile memory, wherein the test system comprises a plurality of channel modules and a device interface, and wherein the test system is operable to test a device under test (DUT), and storing second calibration information of the calibration data on a second non-volatile memory associated with the device interface, where the first calibration information is associated with the plurality of channel modules of the test system, and where the second calibration information is associated with the device interface of the test system.

According to some embodiments, the device interface comprises a high-speed digital interface.

According to some embodiments, the calibration data comprises frequency characteristics of components of the test system for transmitting signals from the plurality of channel modules to the DUT.

According to some embodiments, the calibration data comprises frequency characteristics for transmitting signals from the plurality of channel modules to the device.

According to some embodiments, the calibration data comprises two data filters describing frequency characteristics.

According to some embodiments, the first calibration information comprises a first data filter, and wherein the second calibration information comprises a second data filter.

According to some embodiments, the first and second data filters comprise compensation filters.

According to some embodiments, the calibration data comprises at least one of: tap coefficients of digital filters; Fourier series; and a two-port network model.

According to some embodiments, the method includes storing third calibration information of the calibration data on a non-volatile memory associated with an attachment of the test system, and the non-volatile memory associated with an attachment is disposed between the plurality of channel modules and the device interface.

According to some embodiments, the non-volatile memory associated with the attachment is coupled to the attachment.

According to some embodiments, the method includes encrypting at least one of: the first calibration information; and the second calibration information.

According to some embodiments, the plurality of channel modules comprises at least one of: a signal generator; and a signal receiver.

According to a different embodiment, a system for testing a device under test (DUT) is disclosed. The system includes a processor, a plurality of channel modules, a device interface, a first non-volatile memory in communication with the processor and associated with the plurality of channel modules, and a second non-volatile memory in communication with the processor and associated with the device interface, wherein the processor is operable to execute instructions to perform a method of storing calibration data for testing the DUT. The method includes storing first calibration information of the calibration data on the first non-volatile memory, and storing second calibration information of the calibration data on the second non-volatile memory. The first calibration information is associated with the plurality of channel module of the test system, and the second calibration information is associated with the device interface of the test system.

According to another embodiment, a non-transitory computer-readable storage medium having embedded therein program instructions, which when executed by one or more processors of a test system, causes the test system to execute a process for storing calibration data for testing a device under test (DUT) is disclosed. The method includes, storing first calibration information of the calibration data on a first non-volatile memory, wherein the test system comprises a plurality of channel modules and a device interface, and wherein the test system is operable to test a device under test (DUT), and storing second calibration information of the calibration data on a second non-volatile memory associated with the device interface. The first calibration information is associated with the plurality of channel module of the test system, and the second calibration information is associated with the device interface of the test system.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 is a block diagram depicting an exemplary information structure including three memory portions for storing calibration information according to another embodiment of the present invention.

FIG. 6 is a block diagram depicting an exemplary automated test equipment including an attachment for testing a device under test according to another embodiment of the present invention;

FIG. 7 is a block diagram depicting an exemplary information structure including two memory portions for storing calibration data according to another embodiment of the present invention;

FIG. 8 is a block diagram depicting an exemplary automated test equipment including a signal receiver for testing a device under test according to another embodiment of the present invention.

DETAILED DESCRIPTION

Figure 2:
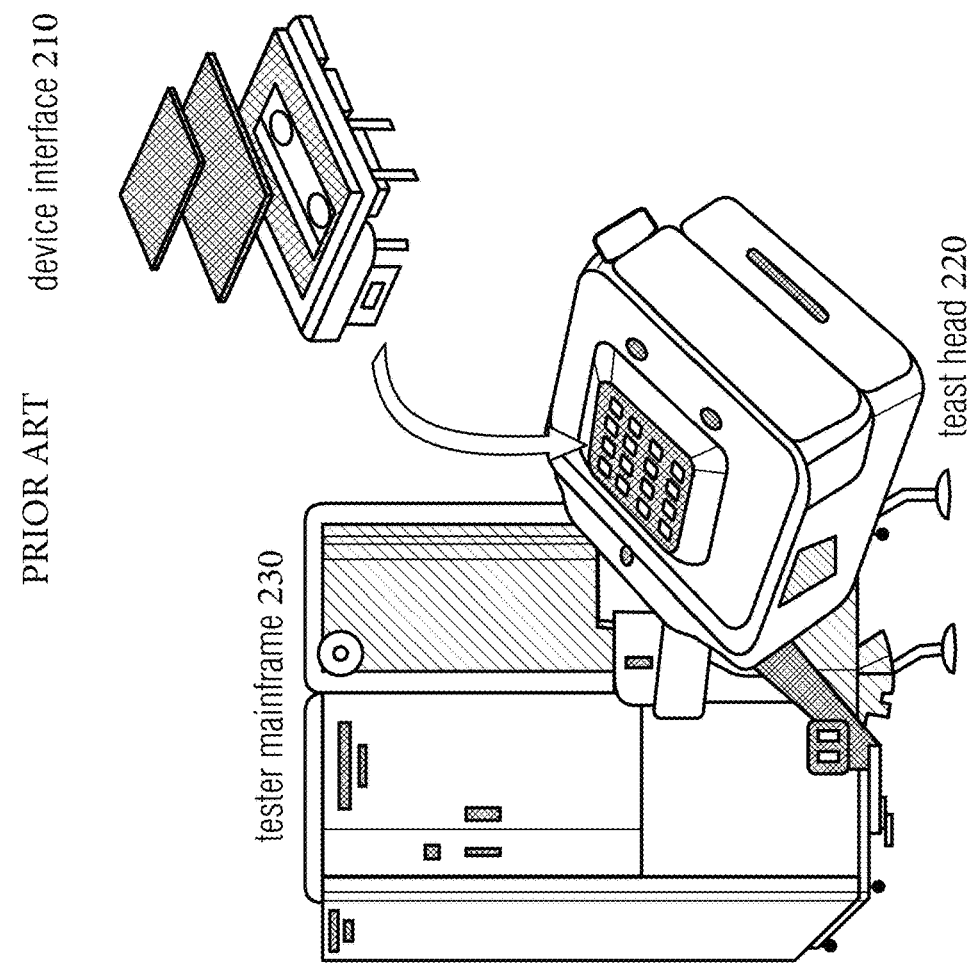
FIG. 2 is a block diagram depicting an exemplary automated test equipment for testing a device under test using a tester mainframe.
Figure 1:
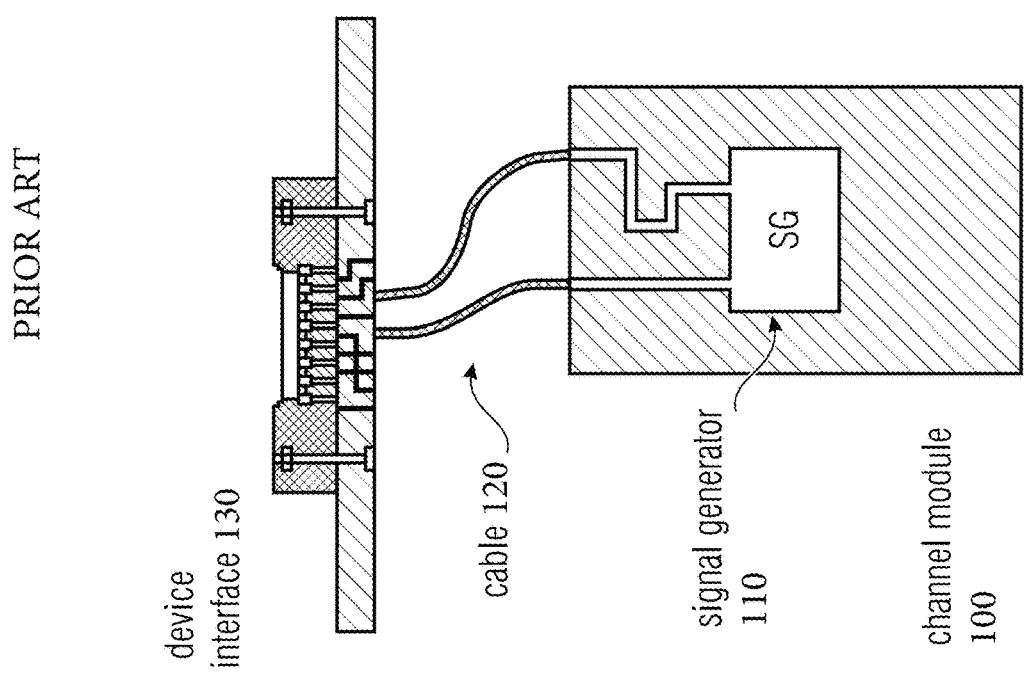
FIG. 1 is a block diagram depicting an exemplary automated test equipment for testing a device under test using a cable coupled to a channel module.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 9) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Storing Calibration Data for Testing a Device Under Test

According to embodiments of the present invention, devices under test (DUTs) are tested by providing them with test data and receiving test results from DUTs in various ways. Testing a device under test requires data transmission in both directions between the test system and the DUTs. Some of these transmissions are transmitted via a device interface.

The data can provide the DUTs with test data, test signals, or test programs, and the data can be processed or converted as desired. The data can represent expected signals or expected results from the device under test that the DUTs return to the test system after the test, for example, or data obtained during testing.

Figures 3, 4:
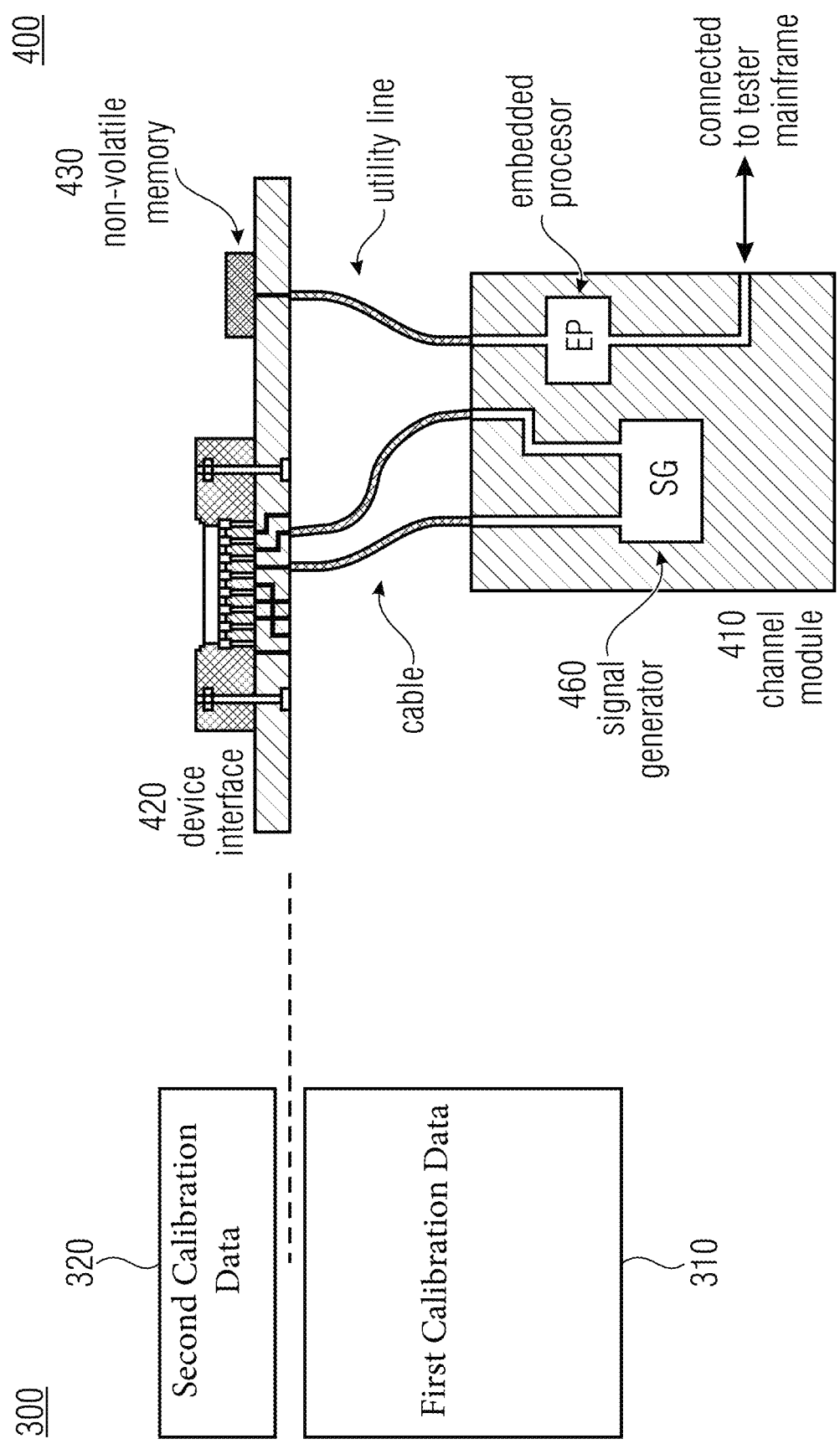
FIG. 3 is a block diagram depicting an exemplary information structure for storing calibration data for testing a device under test according to an embodiment of the present invention.
FIG. 4 is a block diagram depicting an exemplary automated test equipment for testing a device under test using an embedded processor according to an embodiment of the present invention.

FIG. 3 depicts an exemplary information structure 300 representing information of the calibration data according to embodiments of the present invention. In the example of FIG. 3, the calibration data includes a first part 310 and a second part 320. FIG. 4 depicts a block diagram of a test system 400 according to an embodiment of the present invention. The test system can be or can include automated test equipment. FIG. 3 and FIG. 4 are described in detail below.

The test system 400 includes one or more channel modules 410 and a device interface 420. The first part 310 of the calibration data 300 is stored on a non-volatile memory 430. The non-volatile memory can be located in different parts of the test system 400. In the example of FIG. 4, the non-volatile memory is located on the device interface and can also be located on one or more of the channel modules 410, as well as attachment 470 (if present). The non-volatile memory 430 is associated with the one or more channel modules 410. The second part 320 of the calibration data 300 is stored on a non-volatile memory 430 associated with the device-under-test interface 420.

The first part 310 of the calibration data can also include data corresponding to the one or more channel modules 410, such as data describing calibration information relating to a respective channel module. The second part 320 of the calibration data can be data corresponding to the device-under-test interface 420, such as data describing calibration information relating to the device interface. The first part 310 of the calibration data can, for example, be a compensation filter corresponding to channel module 410. This can also include the cable as depicted in FIGS. 4, 6, and 8. The second part 320 of the calibration data can be a compensation filter corresponding to the device interface 420, for example.

The device interface 420 serves to connect to a device under test for testing by the test system 400. Alternatively, the device interface can be used to connect a calibration module (not shown) for calibration purposes. The test system can include multiple channel modules 410, although only one is depicted in the figures. The device-under-test interface 420 can be a high-speed digital interface for testing devices-under-test with high-speed capabilities.

The calibration data can further contain information of frequency characteristics of components for transmitting signals from the one or more channel modules 410 to the device-under-test. In this case, the channel module can include a signal generator 460 as shown in FIGS. 4 and 6. Communication can also be performed in the other direction for signals transmitted from the device-under-test to the channel modules 410. In this case, the channel modules 410 can include a signal receiver 465 as depicted in FIG. 8. Although the respective figures show different arrangements of the embodiments of the present invention, the channel modules 410 can include either a signal generator 460 and/or a signal receiver 465 in any combination according to embodiments.

The calibration data can include at least two filters describing the frequency characteristics. For example, the first part 310 of the calibration data is a first filter, and the second part 320 of the calibration data is a second filter. In some embodiments, the first part and the second part can be the same filter.

According to one embodiment, the first filter only contains information that refers to the channel modules, and the second filter only contains information regarding the device interface. The required information (e.g., calibration data) can be measured during manufacturing of the device interface and the test system. Each component can be measured by a network analyzer or oscilloscope, for example, and the obtained frequency response is stored as an appropriate parameter in non-volatile memory. In this way, each component can be associated with specific calibration data.

The filters can include compensation filters. The calibration data can further include transmission functions, which describe the frequency characteristics of the individual parts of the test system 400. In other examples, the calibration data can contain tap coefficients of digital filters, Fourier series, and/or a two-port network model used to describe the calibration information of a respective part of the test system 400.

The calibration data, or the parts of it, can also be unified. The unification can be based on a convolution for a time domain, a multiplication for a frequency domain, and/or cascaded two-port networks for two-port networks. Generally, part of the calibration data (e.g., the filters) describe frequency characteristics of components that compose the signal path or paths from the signal generator 460 to the device-under-test, or from the device-under-test to the signal receiver 465 as shown later. The frequency characteristic may be stored as a transmission function instead of a compensation filter (e.g., the reciprocal of the transmission function). The information may include tap coefficients of digital filters, Fourier series and/or a two-port network model. The data, can be unified using convolution if the filters are described in time domain, multiplication if the filters are described in frequency domain, or cascaded two-port networks if the filters are described as two-port networks.

FIG. 6 depicts a block schematic diagram of an exemplary automated test equipment 600 according to embodiments of the present invention. In the example of FIG. 6, non-volatile memories 430, 440, and 450 are included. Components of the test system 600, such as the channel module 410, the device interface 420 and the attachment 470, can include its own non-volatile memory, 430, 440, and 450, respectively. In this way, the respective calibration data can be advantageously stored on the part of the test system it belongs to.

FIG. 5 depicts a block schematic diagram of an exemplary information structure according to another embodiment of the present invention, where the calibration data can be divided into more than two parts. In the example of FIG. 5, the calibration data can be divided into three parts corresponding to device interface 420, attachment 470, and channel module 410. Non-volatile memory 440 can be located on respective channel modules and is associated with the one or more channel modules 410. The non-volatile memory 430 associated with the device-under-test interface 420 can be located on the device interface.

The test system 600 can further include an attachment 470, which can be located between the one or more channel modules 410 and the device interface 420. The calibration data can contain a third part 330 of the calibration data, which corresponds to the attachment. This third part 330 can then be stored on a non-volatile memory 430, 440, 450 associated with the attachment. The non-volatile memory can be located on the attachment 470 itself, on one or more of the channel modules 410, and/or on the device interface 420.

FIG. 7 depicts a block diagram of an exemplary information structure according to embodiments of the present invention. FIG. 8 depicts a block diagram of exemplary automated test equipment according to embodiments of the present invention. FIG. 7 and FIG. 8 are described in detail below.

As depicted in FIG. 8, test system 800 and channel modules 410 can include a signal generator 460 and a signal receiver 465, and one or more of the channel modules 410 includes a signal receiver 465. A calibration module can be used for calibrating the test system 800. Thus, the invention is also applicable to the case where the device under test is replaced by a calibration module that calibrate the test system itself. The information of the first 310, second 320 and/or third 330 part of the calibration data can also refer to a memory address and an identification code of an associated device. The associated device can include one or more channel modules 410, the device interface 420, and/or the attachment 470.

The calibration data can then be stored in a storage device at the memory address. This storage device can be located in the tester mainframe, or in any other accessible memory location. This memory location can be accessible via a wired or wireless connection. The memory address describes the actual location of the calibration data. When only the address is stored in the respective non-volatile memory (e.g., one of 430, 440, or 450), the storage size can advantageously be reduced.

The memory for which the address is stored in the non-volatile memory (one of 430, 440, and 450), can be a part of or connected to the test system, or the tester mainframe. When the memory is connected to the test system or tester mainframe, this connection can be provided by a wired or wireless data connection. In other words, the non-volatile memory (e.g., memory 430, 440, and 450) may only store an identification information (ID), and other information (e.g., filter information) may be stored in other storage space such as an external server via that is accessible over a network (e.g., WiFi or LAN).

One embodiment refers directly and solely to the device interface 420 as described above, which is an individual part of the test system, which can contain its own calibration data thereby. The device interface 420, however, it is noted, can be modified also by the important points and aspects described here. These can also either be used individually or in combination and can be included in the device interface 420 described herein, as individual devices or in combination.

Figure 9:
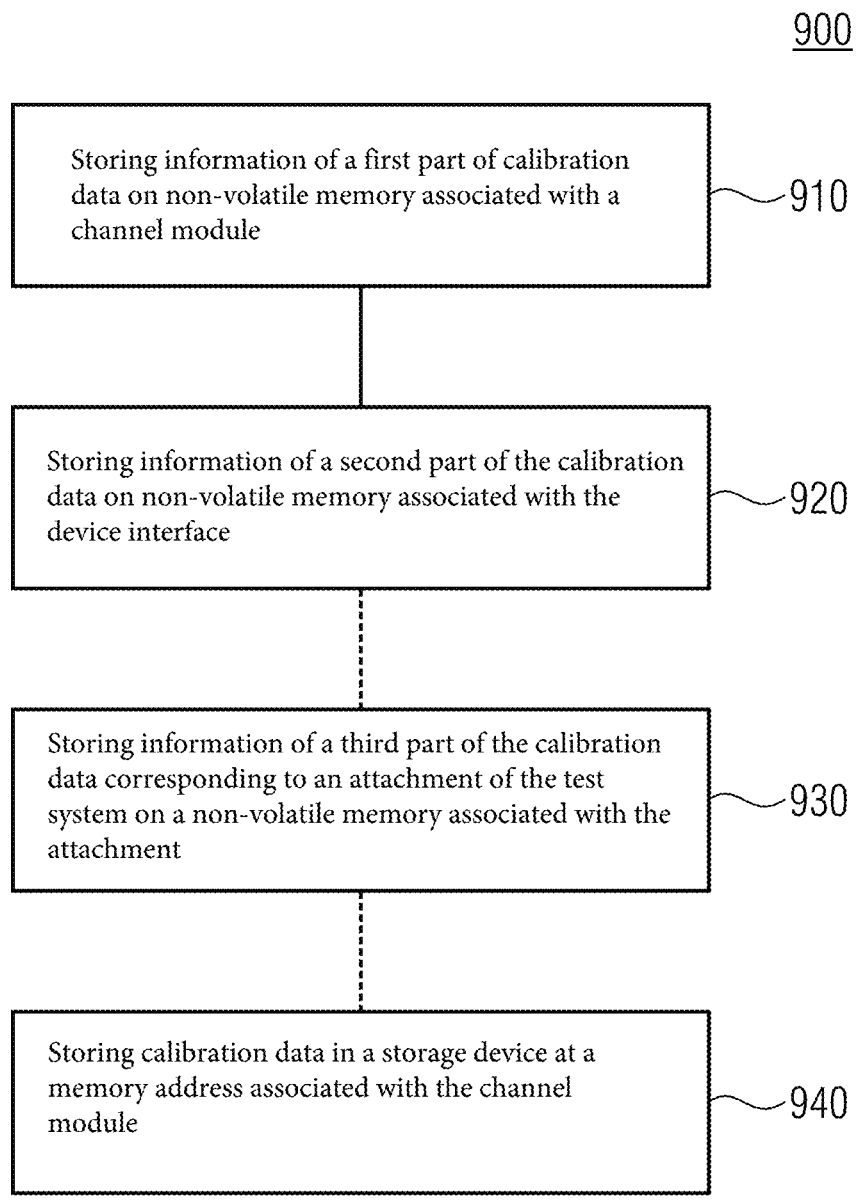
FIG. 9 is a flow chart depicting an exemplary computer-implemented process for storing calibration data for testing a device under test according to embodiment of the present invention.

FIG. 9 depicts a flow chart of a computer implemented sequence of steps of a process 900 for storing calibration data for a device interface in a test system according to embodiments of the present invention. The method includes storing at least information of a first part of the calibration data on a non-volatile memory associated with the one or more channel modules (910), and storing at least information of a second part of the calibration data on a non-volatile memory associated with the device interface (920).

Further optional steps of the process 900 are indicated in FIG. 9 by dotted lines. If the test system includes an attachment, the process 900 can further include storing at least information of a third part of the calibration data corresponding to the attachment on a non-volatile memory associated with the attachment (930). According to some embodiments, the stored information may be encrypted.

Process 900 can further include storing the calibration data in a storage device at the memory address when the first, second and/or third part of the calibration data relates to a memory address and an identification code of an associated channel module, device interface, and/or attachment (940).

According to some embodiments, the calibration data, (e.g., filter information), can be included in its components itself. This feature improves portability of calibration data. Further, the total data, (e.g., data of the filter), can be generated using a relatively small computation cost.

Although some aspects have been described in the context of an apparatus, the disclosed aspects can also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention include a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier. Other embodiments include the computer program for performing one of the methods described herein, stored on a machine readable carrier. In other words, an embodiment of the inventive method is, therefore, a computer program having a program code for performing one of the methods described herein, when the computer program runs on a computer.

According to some embodiments, a data stream or a sequence of signals representing the computer program for performing one of the methods described herein. The data stream or the sequence of signals may for example be configured to be transferred via a data communication connection, for example via the Internet.

A further embodiment includes a processing means, for example a computer, or a programmable logic device, configured to or adapted to perform one of the methods described herein.

A further embodiment includes a computer having installed thereon the computer program for performing one of the methods described herein.

A further embodiment according to the invention includes an apparatus or a system configured to transfer (for example, electronically or optically) a computer program for performing one of the methods described herein to a receiver. The receiver may, for example, be a computer, a mobile device, a memory device or the like. The apparatus or system may, for example, include a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor to perform one of the methods described herein. Generally, the methods are preferably performed by any hardware apparatus.

Although some aspects have been described in the context of an apparatus some aspects disclosed also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments include a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code can for example be stored on a machine-readable medium.

Other embodiments include the computer program for performing one of the methods described herein, stored on a machine-readable medium.

A further embodiment of the inventive method is, therefore, a data stream or a sequence of signals representing the computer program for performing one of the methods described herein. The data stream or the sequence of signals can for example be configured to be transferred via a data communication connection, for example via the internet.

A further embodiment according to the invention includes an apparatus or a system configured to transfer (for example, electronically or optically) a computer program for performing one of the methods described herein to a receiver. The receiver can, for example, be a computer, a mobile device, a memory device or the like. The apparatus or system can, for example, include a file server for transferring the computer program to the receiver.

In some embodiments, a programmable logic device (for example a field programmable gate array) can be used to perform some or all of the functionalities of the methods described herein. In some embodiments, a field programmable gate array can cooperate with a microprocessor to perform one of the methods described herein. Generally, the methods are preferably performed by any hardware apparatus.

The apparatus described herein can be implemented using a hardware apparatus, or using a computer, or using a combination of a hardware apparatus and a computer. The apparatus described herein, or any components of the apparatus described herein, can be implemented at least partially in hardware and/or in software. The methods described herein can be performed using a hardware apparatus, or using a computer, or using a combination of a hardware apparatus and a computer.

Embodiments of the present invention are thus described. While the present invention has been described in particular embodiments, it should be appreciated that the present invention should not be construed as limited by such embodiments, but rather construed according to the following claims.

What is claimed is:

1. A method of storing calibration data of a test system, the method comprising:
   storing first calibration information of the calibration data on a first non-volatile memory, wherein the test system comprises a plurality of channel modules and a device interface, wherein the plurality of channel modules comprise an embedded processor and the first non-volatile memory, and wherein the test system is operable to test a device under test (DUT); and storing second calibration information of the calibration data on a second non-volatile memory associated with the device interface, wherein the first calibration information is associated with the plurality of channel modules of the test system, and wherein the second calibration information is associated with the device interface of the test system.

2. The method of claim 1, wherein the device interface comprises a high-speed digital interface.

3. The method of claim 2, wherein the second calibration information comprises frequency characteristics of the high-speed digital interface.

4. The method of claim 1, wherein the first calibration information comprises frequency characteristics for transmitting signals from the plurality of channel modules to the device interface.

5. The method of claim 1, wherein the calibration data comprises two data filters describing frequency characteristics of the test system.

6. The method of claim 1, wherein the first calibration information comprises a first data filter, and wherein the second calibration information comprises a second data filter.

7. The method of claim 6, wherein the first and second data filters comprise compensation filters.

8. The method of claim 1, wherein the calibration data comprises at least one of: tap coefficients of digital filters; Fourier series; and a two-port network model.

9. The method of claim 1, further comprising storing third calibration information of the calibration data on a non-volatile memory associated with an attachment of the test system, wherein the attachment couples the plurality of channel modules to the device interface.

10. The method of claim 9, wherein the non-volatile memory associated with the attachment is disposed between the plurality of channel modules and the device interface.

11. The method of claim 10, wherein the non-volatile memory associated with the attachment is coupled to the attachment.

12. The method of claim 1, further comprising encrypting at least one of: the first calibration information; and the second calibration information.

13. The method of claim 1, wherein the plurality of channel modules comprises a signal generator operable to generate signal that is transmitted to the DUT to test the DUT.

14. The method of claim 1, wherein the plurality of channel modules comprises a signal receiver operable to receive a signal generated by the DUT to test the DUT.

15. A system for testing a device under test (DUT), the system comprising:

a processor;
a plurality of channel modules;
a device interface;
a first non-volatile memory in communication with the processor and associated with the plurality of channel modules, wherein the plurality of channel modules comprise an embedded processor and the first non-volatile memory; and
a second non-volatile memory in communication with the processor and associated with the device interface, wherein the processor is operable to execute instructions to perform a method of storing calibration data for testing the DUT, the method comprising:
storing first calibration information of the calibration data on the first non-volatile memory; and
storing second calibration information of the calibration data on the second non-volatile memory,
wherein the first calibration information is associated with the plurality of channel modules, and
wherein the second calibration information is associated with the device interface.

16. The system of claim 15, wherein the device interface comprises a high-speed digital interface.

17. The system of claim 16, wherein the first calibration information comprises frequency characteristics for transmitting signals from the plurality of channel modules to the device interface.

18. The system of claim 15, wherein the first calibration information comprises frequency characteristics for transmitting signals from the plurality of channel modules to the device interface.

19. The system of claim 15, wherein the calibration data comprises two data filters describing frequency characteristics.

20. A non-transitory computer-readable storage medium having embedded therein program instructions, which when executed by one or more processors of a test system, causes the test system to execute a method for storing calibration data for testing a device under test (DUT), wherein the method includes:

storing first calibration information of the calibration data on a first non-volatile memory, wherein the test system comprises a plurality of channel modules and a device interface, wherein the plurality of channel modules comprise an embedded processor and the first non-volatile memory, and wherein the test system is operable to test a device under test (DUT); and storing second calibration information of the calibration data on a second non-volatile memory associated with the device interface, wherein the first calibration information is associated with the plurality of channel module of the test system, and wherein the second calibration information is associated with the device interface of the test system.

* * * * *